United States Patent
Ikeda et al.

(10) Patent No.: US 12,046,453 B2
(45) Date of Patent: Jul. 23, 2024

(54) PLASMA PROCESSING APPARATUS

(71) Applicant: TOKYO ELECTRON LIMITED, Tokyo (JP)

(72) Inventors: Taro Ikeda, Nirasaki (JP); Atsushi Kubo, Tokyo (JP); Eiki Kamata, Nirasaki (JP); Nobuhiko Yamamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 484 days.

(21) Appl. No.: 17/018,532

(22) Filed: Sep. 11, 2020

(65) Prior Publication Data

US 2021/0082727 A1 Mar. 18, 2021

(30) Foreign Application Priority Data

Sep. 13, 2019 (JP) ................... 2019-167110

(51) Int. Cl.
*H01J 37/32* (2006.01)
*C23C 16/511* (2006.01)
*C23C 16/52* (2006.01)
*H01L 21/67* (2006.01)

(52) U.S. Cl.
CPC .......... *H01J 37/3222* (2013.01); *C23C 16/52* (2013.01); *H01J 37/32266* (2013.01); *H01J 37/32311* (2013.01); *H01L 21/67288* (2013.01); *C23C 16/511* (2013.01); *H01J 37/32201* (2013.01); *H01J 37/32229* (2013.01); *H01J 37/32293* (2013.01); *H01J 37/3244* (2013.01); *H01J 37/32715* (2013.01); *H01J 2237/202* (2013.01)

(58) Field of Classification Search
CPC ............. H01J 37/3244; H01J 37/32715; H01J 2237/202; H01J 37/32192–32311; H01L 21/67288; C23C 15/511; C23C 15/52
See application file for complete search history.

(56) References Cited

U.S. PATENT DOCUMENTS

| | | | |
|---|---|---|---|
| 6,830,652 B1 * | 12/2004 | Ohmi | C23C 16/45578 118/723 MW |
| 8,373,086 B2 * | 2/2013 | Kim | H01J 37/32009 156/345.47 |
| 2010/0282709 A1 * | 11/2010 | Kang | H01L 51/0029 216/13 |
| 2015/0179408 A1 * | 6/2015 | Shimomura | H01J 37/32211 438/758 |
| 2015/0340225 A1 | 11/2015 | Kim et al. | |

(Continued)

FOREIGN PATENT DOCUMENTS

| | | | | |
|---|---|---|---|---|
| JP | 2013045551 A | * | 3/2013 | ............ C23C 16/34 |
| KR | 10-2009-0105530 A | | 10/2009 | |

(Continued)

*Primary Examiner* — Kurt Sweely
(74) *Attorney, Agent, or Firm* — Nath, Goldberg & Meyer; Jerald L. Meyer; Tanya E. Harkins

(57) ABSTRACT

A plasma processing apparatus includes: a processing container; a substrate holder disposed within the processing container and configured to hold a substrate thereon; a dielectric window disposed below the substrate holder; and a plurality of phased array antennas disposed below the dielectric window and configured to irradiate a plurality of electromagnetic waves.

12 Claims, 15 Drawing Sheets

(56) References Cited

U.S. PATENT DOCUMENTS

| | | | | |
|---|---|---|---|---|
| 2017/0133202 A1* | 5/2017 | Berry, III | ........... | H01J 37/32449 |
| 2017/0263417 A1* | 9/2017 | Ikeda | ................ | H01J 37/32266 |
| 2017/0350688 A1* | 12/2017 | Boyd, Jr. | ................ | G01B 11/14 |
| 2018/0342374 A1* | 11/2018 | Liang | .................. | H01J 37/3222 |

FOREIGN PATENT DOCUMENTS

| | | |
|---|---|---|
| KR | 10-2013-0006351 A | 1/2013 |
| KR | 10-2018-0011712 A | 2/2018 |
| KR | 10-2018-0074633 A | 7/2018 |

* cited by examiner

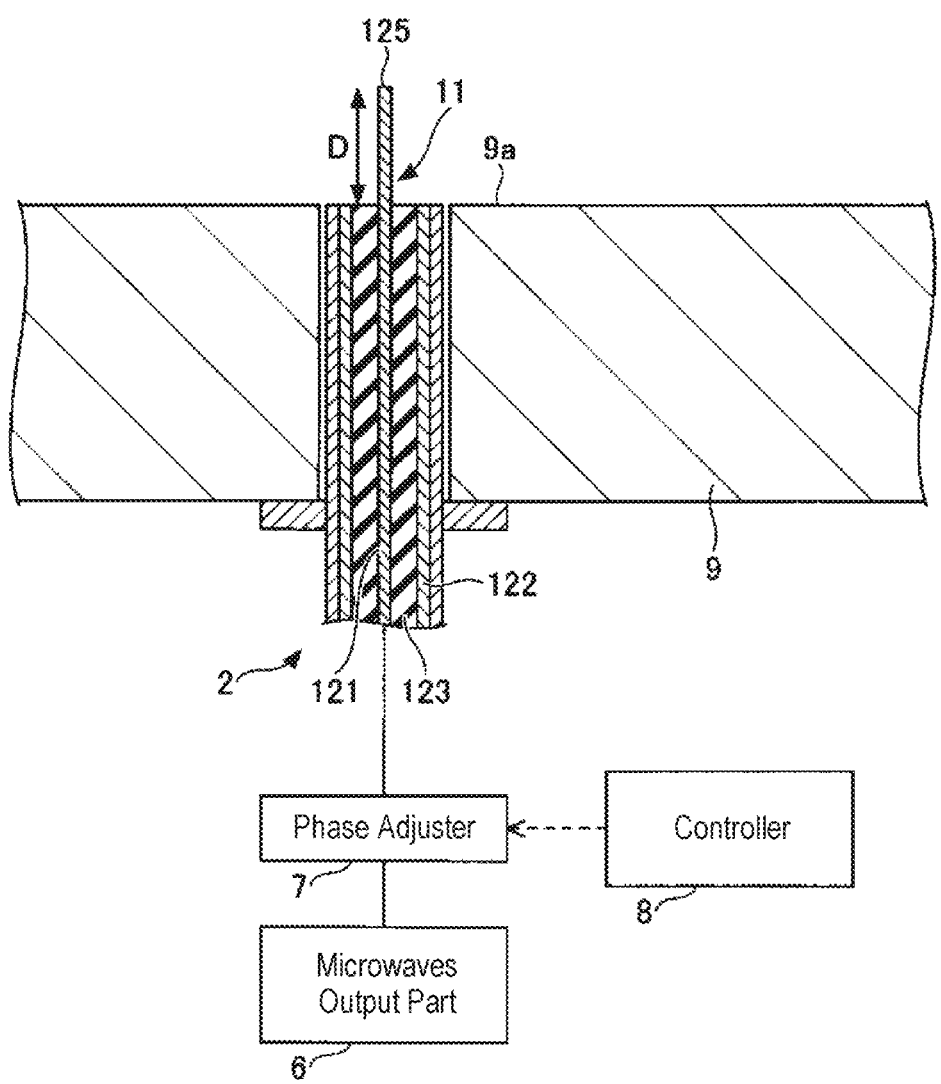

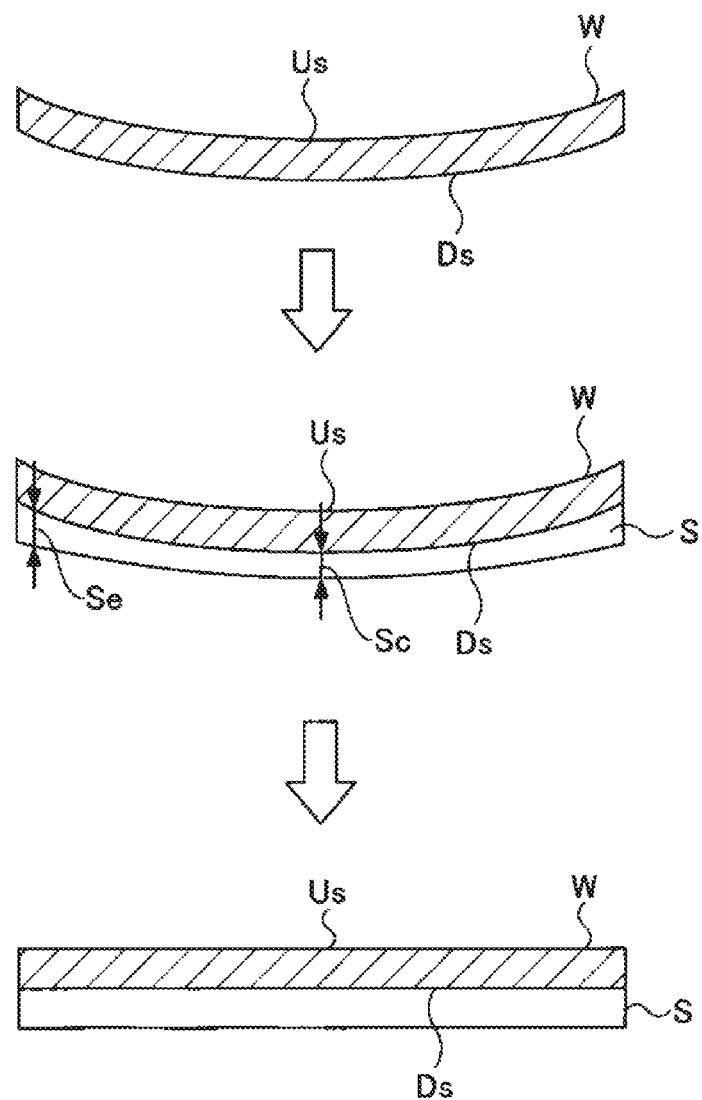

PLASMA PROCESSING APPARATUS

CROSS-REFERENCE TO RELATED APPLICATION

This application is based upon and claims the benefit of priority from Japanese Patent Application No. 2019-167110, filed on Sep. 13, 2019, the entire contents of which are incorporated herein by reference.

TECHNICAL FIELD

The present disclosure relates to a plasma processing apparatus and a plasma processing method.

BACKGROUND

In a process of, for example, 3D NAND, since a formed film is relatively thick, a curvature of a substrate tends to increase. When the substrate is curved, pattern deviation may occur during an exposure process. Such a pattern deviation in the exposure process may be prevented by relieving a stress on the substrate so as to make the substrate flat.

As a method of relieving the stress on the substrate, for example, Patent Document 1 proposes reducing the stress applied to the substrate after element formation by forming a film not only on a front surface but also on a rear surface of the substrate.

PRIOR ART DOCUMENT

Patent Document

Patent Document 1: U.S. Patent Application Publication No. 2015/0340225

SUMMARY

According to an embodiment of the present disclosure, there is provided a plasma processing apparatus that includes: a processing container; a substrate holder disposed within the processing container and configured to hold a substrate thereon; a dielectric window disposed below the substrate holder; and a plurality of phased array antennas disposed below the dielectric window and configured to irradiate a plurality of electromagnetic waves.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a view illustrating an exemplary phased array antenna according to an embodiment of the present disclosure.

FIG. 11 is a view showing an exemplary effect of a plasma processing method according to an embodiment of the present disclosure.

DETAILED DESCRIPTION

Figure 1A:
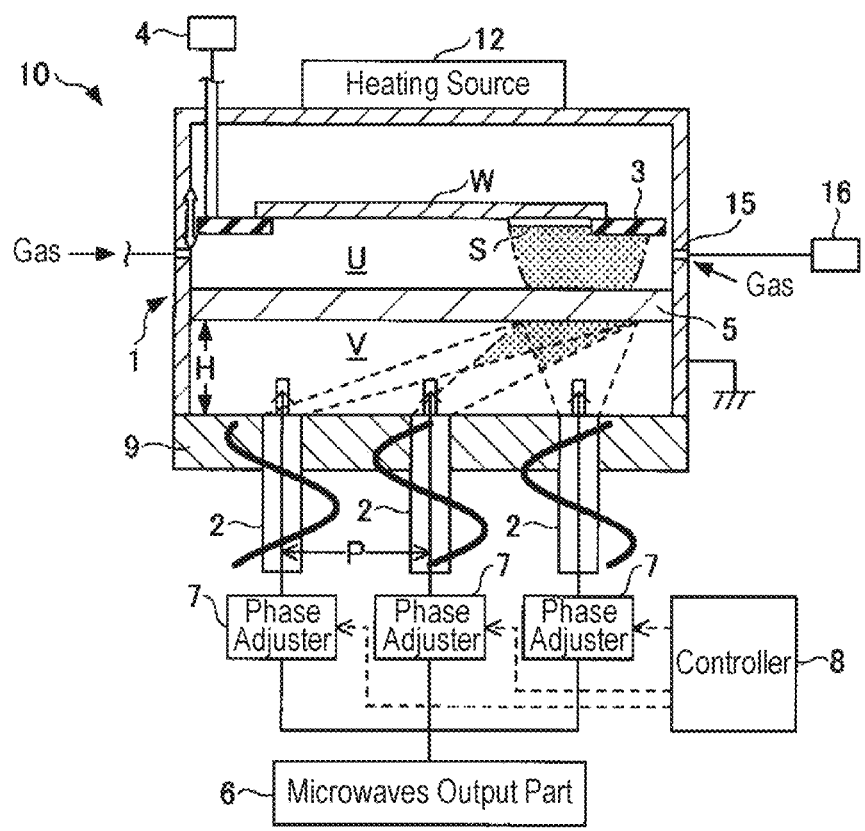
FIG. 1A is a schematic cross-sectional view illustrating an exemplary plasma processing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

[Plasma Processing Apparatus]

Figure 1B:
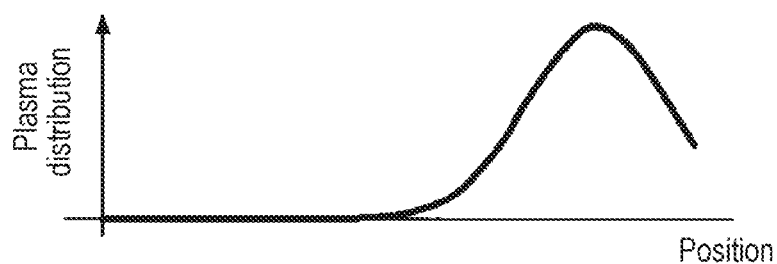
FIG. 1B is a graph showing a plasma distribution on a substrate processed using the plasma processing apparatus according to the embodiment of the present disclosure.
Figure 1C:
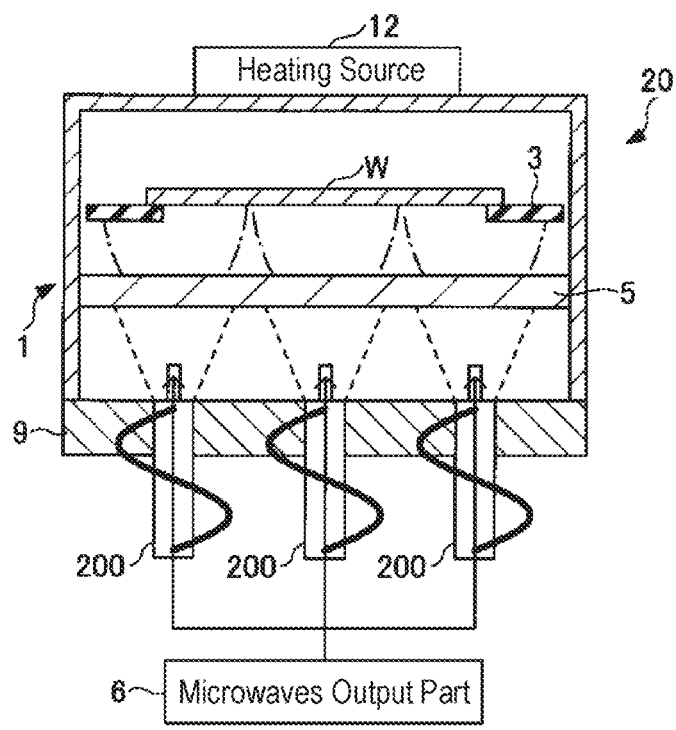
FIG. 1C is a schematic cross-sectional view illustrating an exemplary plasma processing apparatus according to a comparative example.
Figure 1D:
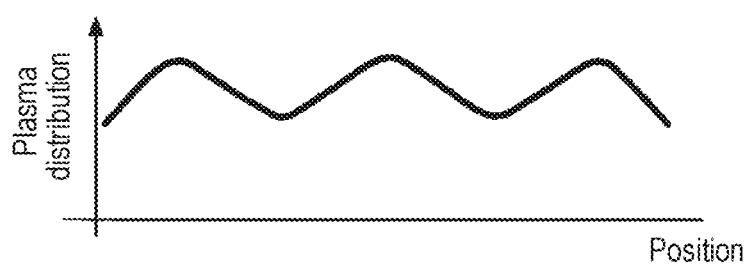
FIG. 1D is a graph showing a plasma distribution on a substrate processed using the plasma processing apparatus according to the comparative example.

A plasma processing apparatus 10 according to an embodiment of the present disclosure will be described with reference to FIGS. 1A to 1D. FIG. 1A is a schematic cross-sectional view illustrating an exemplary plasma processing apparatus 10 according to the embodiment. Hereinafter, a microwave plasma processing apparatus will be described as the exemplary plasma processing apparatus 10. FIG. 1C illustrates a microwave plasma processing apparatus (hereinafter, referred to as a plasma processing apparatus 20) according to a comparative example.

The plasma processing apparatus 10 according to the embodiment illustrated in FIG. 1A includes a processing container 1 that accommodates a substrate W such as a wafer. The plasma processing apparatus 10 performs a predetermined plasma process, such as a film-forming process or an etching process, on the substrate W by using plasma formed by microwaves.

The processing container 1 is a substantially cylindrical container and is grounded. An opening at a bottom surface of the processing container 1 is closed by a bottom plate 9 and accordingly, it is possible to keep an inside of the processing container 1 airtight. The processing container 1 and the bottom plate 9 are made of a metal material such as aluminum or stainless steel.

A substrate holding mechanism (or a substrate holder) 3 configured to hold the substrate W is provided within the processing container 1. Examples of a material forming the substrate holding mechanism 3 include a dielectric material (quartz or ceramic such as alumina). The substrate holding mechanism 3 may include, for example, an electrostatic chuck configured to electrostatically attract the substrate W and a temperature control mechanism. A driving mechanism 4 is connected to the substrate holding mechanism 3. The substrate holding mechanism 3 is movable in an up-and-down direction in the processing container 1 by the driving mechanism 4, whereby a height of the substrate W is adjustable.

An exhaust pipe (not illustrated) is connected to the processing container 1, and an exhaust apparatus including a vacuum pump is connected to the exhaust pipe. When the exhaust apparatus is operated, the inside of the processing container 1 is evacuated, whereby the inside of the processing container 1 is depressurized to a predetermined degree of vacuum. A side wall of the processing container 1 is provided with a loading/unloading port (not illustrated) configured to load/unload the substrate W therethrough and a gate valve (not illustrated) for opening/closing the loading/unloading port. The bottom plate 9 is provided with seven phased array antennas 2 (only three antennas are shown in FIGS. 1A to 1D) configured to radiate microwaves into the processing container 1. The phased array antennas 2 radiate electromagnetic waves such as microwaves. A phased array antenna may usually refer to an antenna assembly in which a plurality of antennas capable of radiating phased-controlled electromagnetic waves are arranged in an array. In the present disclosure, each of the antennas constituting such a phased array antenna is referred to as the phased array antenna 2.

FIG. 2 illustrates an example of a phased array antenna 2. The phased array antenna 2 has a coaxial cable shape, and includes an inner conductor 121, an outer conductor 122 outside the inner conductor 121, and a dielectric 123 such as Teflon (registered trademark) provided therebetween. A tip end of the phased array antenna 2 constitutes a monopole antenna 11 including an inner conductor 121 protruding by a length D. The dimension (the length D) of the monopole antenna 11 changes depending on a frequency of electromagnetic waves. For example, when the microwave frequency is 300 MHz to 3 GHz, the length D is several tens of mm to several hundreds of mm.

By exposing the monopole antenna 11 from an end of the dielectric 123, which is a surface having the same height as an inner surface 9a of the bottom plate 9, to the inner space of the processing container 1, microwaves are irradiated from a irradiating portion 125 to the processing container 1. However, the inner conductor 121 may not protrude from the dielectric 123. In this case, a cutout portion where the outer conductor 122 does not exist is formed at the tip end of the phased array antenna 2, and microwaves are irradiated into the processing container 1 from a radiation port at the tip end of the inner conductor 121 via the cutout portion. For example, the antenna constituting the phased array antenna 2 may be an antenna having a form different from that of a monopole antenna, such as a helical antenna.

With such a configuration, microwaves are output from a microwaves output part 6, are phase-controlled by a phase adjuster 7 under the control of a controller 8, and are then irradiated into the processing container 1. The number of phased array antennas 2 is not limited to seven, and may be two or more, or more specifically three or more.

Returning back to FIG. 1A, the phased array antennas are arranged at substantially equal intervals such that a distance P from a center of each phased array antenna 2 to a center of an adjacent phased array antenna 2 is smaller than $\lambda/2$ with respect to a wavelength $\lambda$ of microwaves. A dielectric window 5 is disposed below the substrate holding mechanism 3 to be spaced apart from the phased array antennas 2 and the substrate holding mechanism 3. The dielectric window 5 is made of, for example, quartz, ceramic such as alumina ($Al_2O_3$), a fluorine-based resin such as polytetrafluoroethylene, or a polyimide-based resin. The dielectric window 5 serves as a partition plate that divides the inside of the processing container 1 into a space U above the dielectric window 5 and a space V below the dielectric window 5. The space V is an atmospheric space, and the space U is a vacuum space.

In the space V above the phased array antenna 2, there is a free space of several tens of mm to several hundreds of mm, and plasma is generated in the space U via the dielectric window 5 installed thereabove. A vertical distance H from the bottom plate 9 to the bottom surface of the dielectric window 5 is larger than $\lambda/4$ with respect to the wavelength $\lambda$ of microwaves. The phased array antennas 2 radiate microwaves in the space V. Seven microwaves irradiated from the seven phased array antennas 2 propagate in the space V. In the space V, the seven microwaves are collected and combined. The combined microwaves pass through the dielectric window 5 and propagate in the space U.

A plurality of gas supply ports 15 are arranged in the side wall of the processing container 1 above the dielectric window 5 at equal intervals in the circumferential direction, and the plurality of gas supply ports 15 are connected to the gas supply part 16. The gas supplied from the gas supply part 16 is evenly introduced into the space U from the plurality of gas supply ports 15. In the space U, local plasma is generated from the gas supplied from the gas supply part 16 by a power of the combined microwaves, and a film is formed on the rear surface of the substrate W by the local plasma. As a result, a film S is formed in the form of a spot on the rear surface of the substrate W where the plasma is generated.

A heating source 12 is disposed on a ceiling of the processing container 1. The heating source 12 may include, for example, a plurality of light-emitting diodes (LEDs). The heating source 12 heats the substrate W by using the plurality of LEDs.

The plasma processing apparatus 10 includes a controller 8. The controller 8 may be a computer including, for example, a processor, a storage such as a memory, an input device, a display device, and a signal input/output interface. The controller 8 controls each part of the plasma processing apparatus 10. In the controller 8, an operator performs, for example, a command input operation by using the input device to manage the plasma processing apparatus 10. In addition, in the controller 8, an operation situation of the plasma processing apparatus 10 may be visualized and displayed by the display device. The storage stores a control program and recipe data. The control program is executed by the processor to execute various kinds of processes in the plasma processing apparatus 10. The processor executes the control program so as to control each part of the plasma processing apparatus 10 according to the recipe data. Further, the processor of the controller 8 controls the phase adjuster 7 included in each phased array antenna 2 so as to control the phase of the microwaves irradiated from the irradiating portions 125.

When performing a plasma process in the plasma processing apparatus 10 having the above-described configuration, first, the substrate W in the state of being held on a transport arm is loaded into the processing container 1 from an opened gate valve via the loading/unloading port.

When the substrate W is transported to a position above the substrate holding mechanism (or a substrate holder) 3, the substrate W is placed on the substrate holding mechanism 3 by raising the substrate holding mechanism 3 from the transport arm. The gate valve is closed after the substrate W is loaded. The pressure inside the processing container 1 is maintained at a predetermined degree of vacuum by an exhaust apparatus. A gas is introduced into the space U above the dielectric window 5, and the phase-controlled microwaves are irradiated into the space V from the seven phased array antennas 2. As a result, since an electric field is strengthened at a predetermined position of the dielectric window 5, it is possible to control a plasma distribution when the gas is converted into the plasma in the space U. The controller 8 forms a predetermined film S on the rear surface of the substrate W depending on the degree of curvature of the substrate W by using the generated plasma. The predetermined film S may be, for example, SiN or $SiO_2$.

As illustrated in FIG. 1C, in the plasma processing apparatus 20 according to the comparative example, microwaves irradiated from seven antennas 200 have the same phase. Accordingly, in the plasma processing apparatus 20 according to the comparative example, when plasma is generated on the dielectric window 5 by the electric fields of the microwaves, an electric field distribution is influenced by the arrangement pattern of the seven antennas 200. As a result, as illustrated in an example in FIG. 1D, an intensity in plasma distribution varies according to the arrangement pattern of the antennas 200. That is, the plasma process performed on a substrate W is likely to be non-uniform due to the influence of the arrangement pattern of the antennas 200.

However, the arrangement pattern of the antennas 200 is a physical arrangement, and it is difficult to change the preset arrangement thereof. Therefore, in the present embodiment, the electric field distribution in the dielectric window 5 is controlled by controlling the phases of microwaves and radiating the microwaves from below the dielectric window 5, regardless of the arrangement of the phased array antennas 2. Thus, the plasma processing apparatus 10 capable of controlling a plasma distribution is provided.

That is, in the plasma processing apparatus 10 according to the present embodiment illustrated in FIG. 1A, the phases of the microwaves irradiated from seven respective phased array antennas 2 are controlled by using the phase adjuster 7 under the control of the controller 8. Thus, the microwaves irradiated from seven respective phased array antennas 2 may interfere with each other, and it is possible to increase the electric field strength at an arbitrary location. This makes it possible to perform an advanced control of the plasma distribution by locally generating the plasma.

For example, in FIG. 1A, the microwaves propagating in the space V interfere with each other by the phase control of the microwaves input from the seven phased array antennas 2, and the electric field strength is increased in the right-hand portion of the dielectric window 5 by combining the microwaves. As a result, as shown in FIG. 1B, a plasma distribution in which the plasma is concentrated on the right-hand side of the substrate W in the space U is obtained, and it is possible to form a film S in the form of a spot in the right-hand portion of the substrate W.

[Phase Control]

Figure 3A:
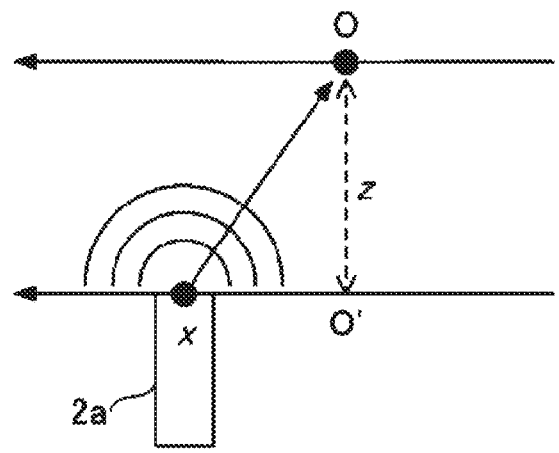
FIGS. 3A to 3C are views describing a phase control according to an embodiment of the present disclosure.
Figure 3B:
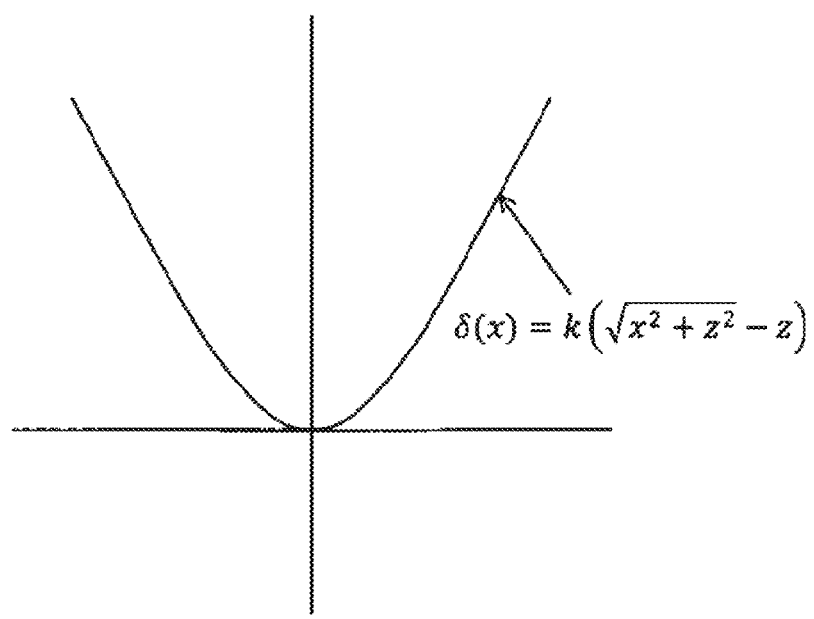
Figure 3C:
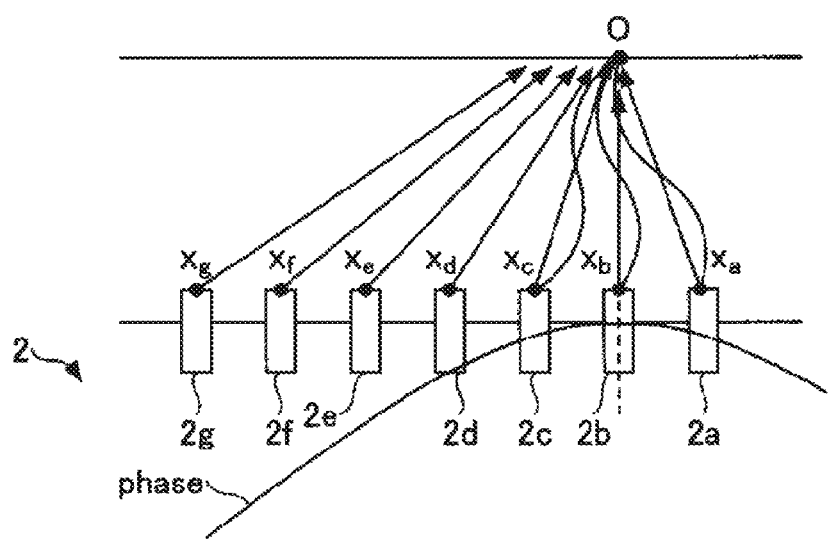

Next, phase control of microwaves will be described with reference to FIGS. 3A to 3C. FIGS. 3A to 3C are views that describe the phase control performed by the controller 8 installed in the plasma processing apparatus 10 according to an embodiment of the present disclosure. FIG. 3A shows a relationship between microwaves irradiated from one of the phased array antennas 2 (in this example, the phased array antenna 2a) and a focal position O on which the electric field is to be focused in the dielectric window 5. Assuming that the position of the surface of the bottom plate 9 which is perpendicular to the focal position O is O', a distance from the focal position O to the position O' on the surface of the bottom plate 9 is Z, and a radiation point of the microwaves irradiated from the phased array antenna 2a is X, the following Equation 1 is established.

$$k\sqrt{x^2+z^2}-\delta(x)=kz \qquad \text{[Equation 1]}$$

In Equation 1, k is a wave number of an electromagnetic wave including microwaves, and is represented by a reciprocal of a wavelength λ of the electromagnetic wave. That is, k=1/λ. δ(x) indicates the phase of the electromagnetic wave (the microwaves in this embodiment) irradiated from the radiation point X.

Transforming Equation 1 yields Equation 2 for obtaining the phase δ(x) of the electromagnetic wave.

$$\delta(x)=k(\sqrt{x^2+z^2}-z) \qquad \text{[Equation 2]}$$

Based on Equation 2, the phase δ(x) of the electromagnetic wave irradiated from the radiation point X is calculated from the wave number k of the electromagnetic wave, the distance Z. and the radiation point X. The curve of FIG. 3B is drawn based on Equation 2.

Conditions under which the phases of microwaves irradiated from two or more phased array antennas 2 are mutually strengthened at the focal position O will be described with reference to FIG. 3C. The seven phased array antennas 2 are referred to as phased array antennas 2a, 2b, 2c, 2d, 2e, 2f, and 2g. In FIG. 3C, for convenience of description, unlike an actual positional relationship of the phased array antennas, the phased array antennas 2 are illustrated as being spaced apart from each other and arranged side by side.

The controller 8 controls the phases $\delta(x_a)$ to $\delta(x_g)$ of respective microwaves irradiated from the phased array antennas 2a to 2g such that the microwaves irradiated from the phased array antennas 2a to 2g are matched in phase at the focal position O from respective radiation points $x_a$ to $x_g$.

Since the radiation points X of the phased array antennas 2a to 2g are different, as shown in Equation 2, the phases δ(x) of the microwaves irradiated from the phased array antennas 2a to 2g are shifted at the focal position O unless the phases are controlled. As a result, even when the microwaves of any one of the phased array antennas 2a to 2g are in a condition where phases of the microwaves are mutually strengthened at the focal position O, microwaves of any one of other phased array antennas are in a condition where the phases are mutually weakened at the focal position O. On the other hand, in the present embodiment, by controlling each of the phases δ(xa) to δ(xg) of the microwaves irradiated from the phased array antennas 2a to 2g, the phases thereof can be mutually strengthened at the focal position O. For example, the phases of the microwaves irradiated from the phased array antennas 2a. 2b, and 2c illustrated in FIG. 3C are in a condition where the phases thereof are mutually strengthened since antinodes of the phases match each other and nodes of the phases match each other. However, even though the phases of the microwaves irradiated from the phased array antennas 2a, 2b, and 2c are controlled so as to be in the condition where the phases are mutually strengthened, there may be a condition where the phases of at least one of the microwaves irradiated from the phased array antennas 2d to 2g are mutually weakened. In this case, at the focal position O, the phases of seven microwaves may not be mutually strengthened.

Meanwhile, in the present embodiment, the phases of the microwaves irradiated from the phased array antennas 2c, 2d, 2e, 2f, and 2g are also controlled in a condition where the microwaves are mutually strengthened. This makes it possible to control the phases of respective microwaves in the condition where the phases of the seven microwaves are mutually strengthened and to focus electric fields of the microwaves on the focal position O in the dielectric window 5.

However, the control for mutually strengthening the phases of the microwaves at the focal position O may be performed for at least two microwaves output from the phased array antennas 2a to 2g, instead of being performed for all of the seven microwaves. For example, there may be one or more phased array antennas 2, which are not subjected to a phase control of microwaves. Further, in the aforementioned description, one focal position O is present in the dielectric window 5, but the present disclosure is not limited thereto. The phases may be controlled to be mutually strengthened at two or more focal positions O in the dielectric window 5 at the same timing.

As illustrated in FIGS. 1A to 1D, the distance P from the center of one phased array antenna 2 to the center of an adjacent phased array antenna 2 is smaller than $\lambda/2$ with respect to the wavelength $\lambda$ of microwaves. This is because, when the distance (spacing) between the phased array antennas 2 adjacent to each other is larger than $\lambda/2$, microwaves may not be collected at the focal position O in the dielectric window 5, and therefore the phases of the microwaves may not be controlled to be mutually strengthened at the focal position O.

The focus matching of the microwaves by the phase control described above can be controlled very quickly because it does not involve mechanical operation. In principle, it is possible to move the focal position O over time with a high-speed control as fast as the microwave frequency. Thus, the phases of the phased array antennas 2 can be controlled at high speed. As a result, the distribution of microwave electric fields in the dielectric window 5 can be controlled at high speed, and thus plasma can be locally generated in the space U above the dielectric window 5.

In the focus matching of the microwaves, as the distance between the substrate holding mechanism 3 and the dielectric window 5 becomes smaller, the diameter of a spot indicating a focus-matching state of the microwaves becomes smaller, and local plasma is generated. Therefore, by adjusting the distance between the substrate holding mechanism 3 and the dielectric window 5 by moving the substrate holding mechanism 3 up or down by the driving mechanism 4, it is possible to form a film at a predetermined position by applying the local plasma to a desired position on the rear surface of the substrate W. Thus, it becomes possible to locally relieve the stress on the substrate W. Further, the controller 8 acquires a curvature distribution of the substrate W from, for example, an optical sensor 13 or an optical monitor, calculates a film formation position and a film thickness based on acquired measurement values, and controls the phased array antennas 2 such that a film having a required film thickness is formed at the film formation position on the rear surface of the substrate W according to the calculation result.

Figure 4:
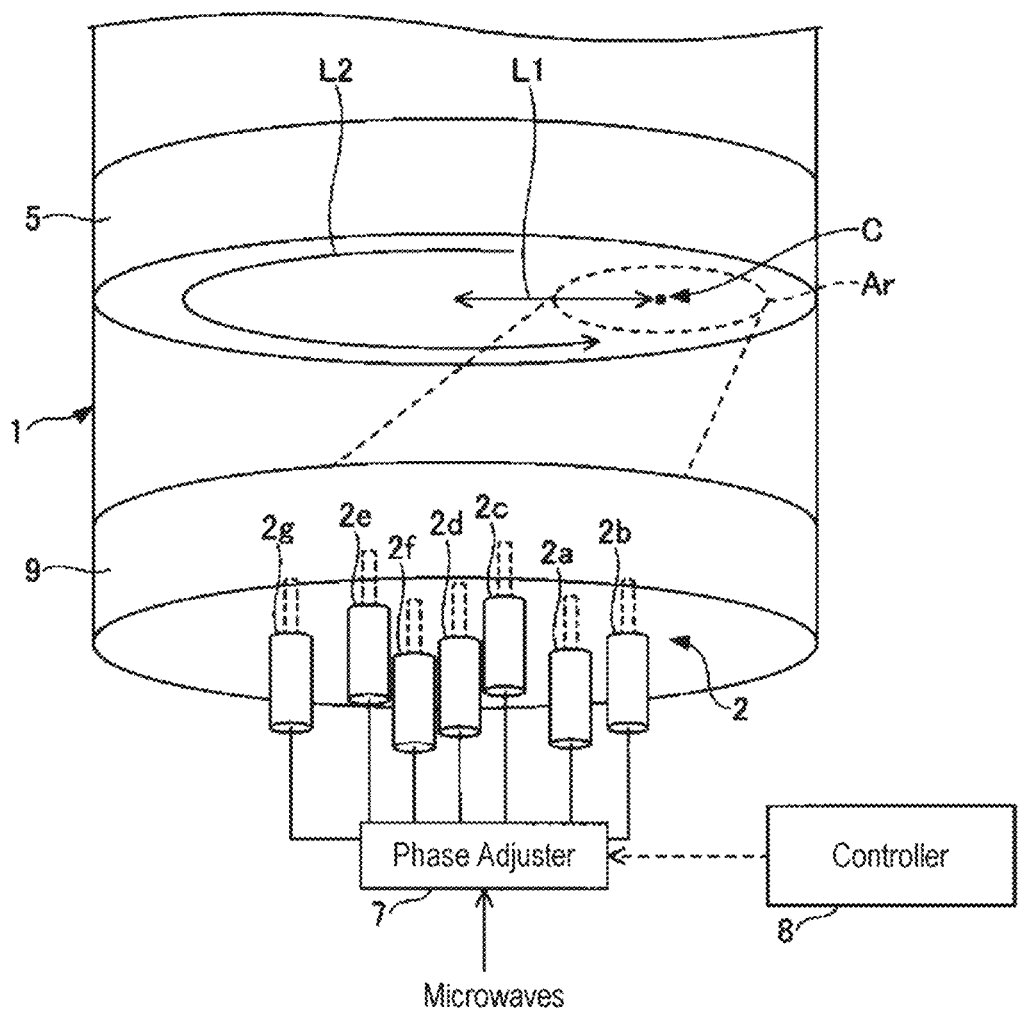
FIG. 4 is a view illustrating an exemplary scan pattern of film formation performed according to a phase control according to an embodiment of the present disclosure.

FIG. 4 is a view illustrating an example of phase control by the controller 8 according to an embodiment of the present disclosure. The controller 8 changes phases of a plurality of microwaves over time and controls a region where plasma is generated. In the example of FIG. 4, the controller 8 uses phase adjusters 7 (only one phase adjuster is illustrated in FIG. 4) to perform a control such that phases $\delta(x_a)$ to $\delta(x_g)$ of microwaves, which are irradiated from the seven phased array antennas 2a, 2b, 2c, 2d, 2e, 2f, and 2g respectively, are mutually strengthened at the focal position C. Thus, it is schematically illustrated that the electric fields of microwaves are controlled to be strengthened in a spot portion Ar centered on the focal position C.

The controller 8 uses the phase adjusters 7 to control the phases $\delta(x_a)$ to $\delta(x_g)$ of microwaves at high speed, and scans the focal position C on the surface of the dielectric window 5 in a radial direction L1 or a circumferential direction L2. Thus, by moving the focal position C and a focus-matching portion Ar at high speed, it is possible to locally generate plasma in the space U above the dielectric window 5.

In addition, the controller 8 may change the moving speed of the focus-matching portion Ar by changing the speed at which the phases $\delta(x_a)$ to $\delta(x_g)$ of microwaves are controlled by using the phase adjusters 7. This makes it possible to freely control an average electric field distribution per unit time. For example, the controller 8 changes the speed at which the phases $\delta(x_a)$ to $\delta(x_g)$ of microwaves are controlled such that the focus-matching portion Ar slowly moves on an outer peripheral side of the dielectric window 5 and the focus-matching portion Ar moves faster on an inner peripheral side than on the outer peripheral side. This makes it possible to make an integrated value of the electric field strength on the outer peripheral side of the dielectric window 5 stronger than an integrated value of the electric field strength on the inner peripheral side. In addition, it is possible to freely control the plasma distribution, for example, to control the plasma density on the outer peripheral side of the dielectric window 5 to be higher than the plasma density on the inner peripheral side of the dielectric window 5.

[Sensor Position]

Figure 5:
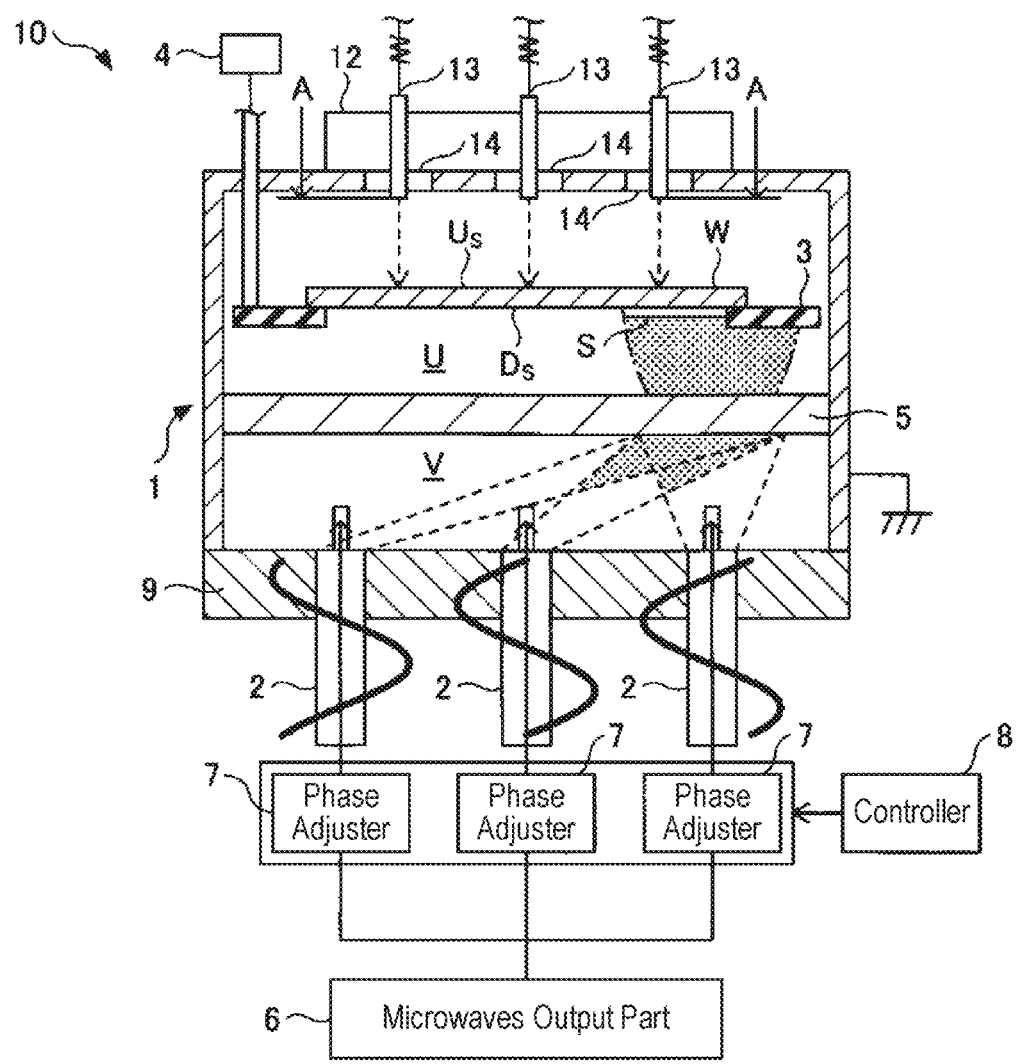
FIG. 5 is a view illustrating exemplary positions of optical sensors of a plasma processing apparatus according to an embodiment of the present disclosure.
Figure 6A:
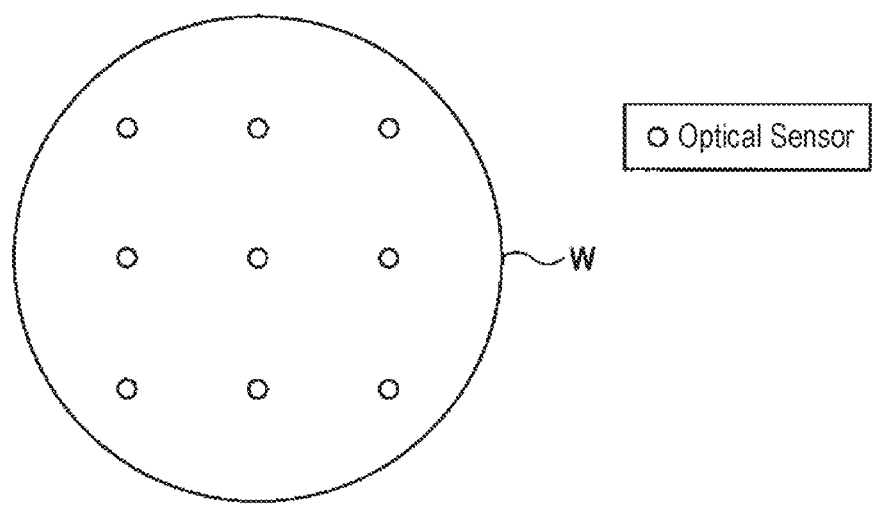
FIGS. 6A to 6C illustrate exemplary plan views taken along a plane A-A in FIG. 5.
Figure 6B:
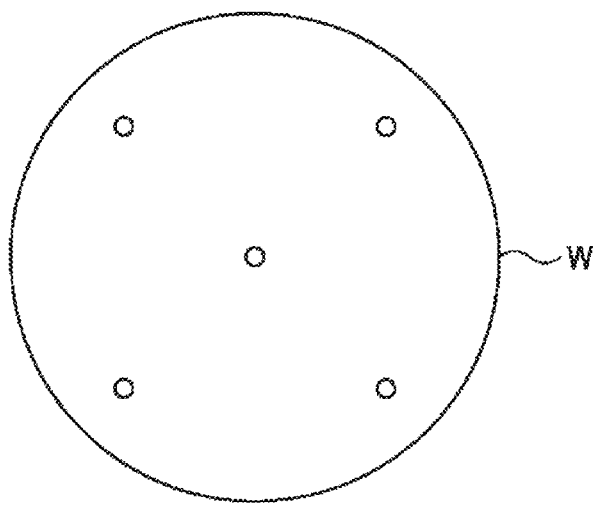
Figure 6C:
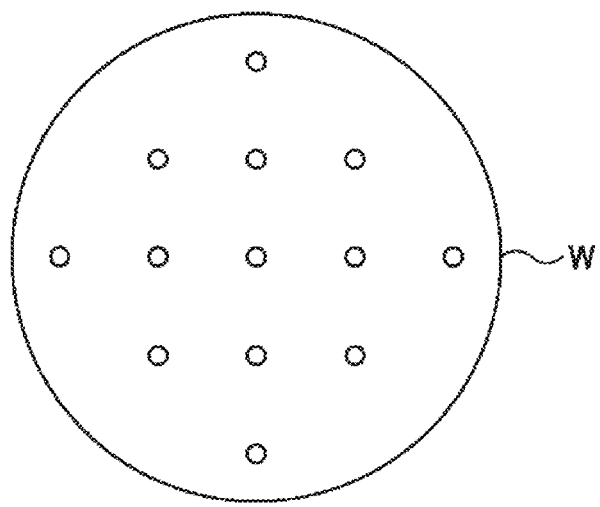
Figure 7:
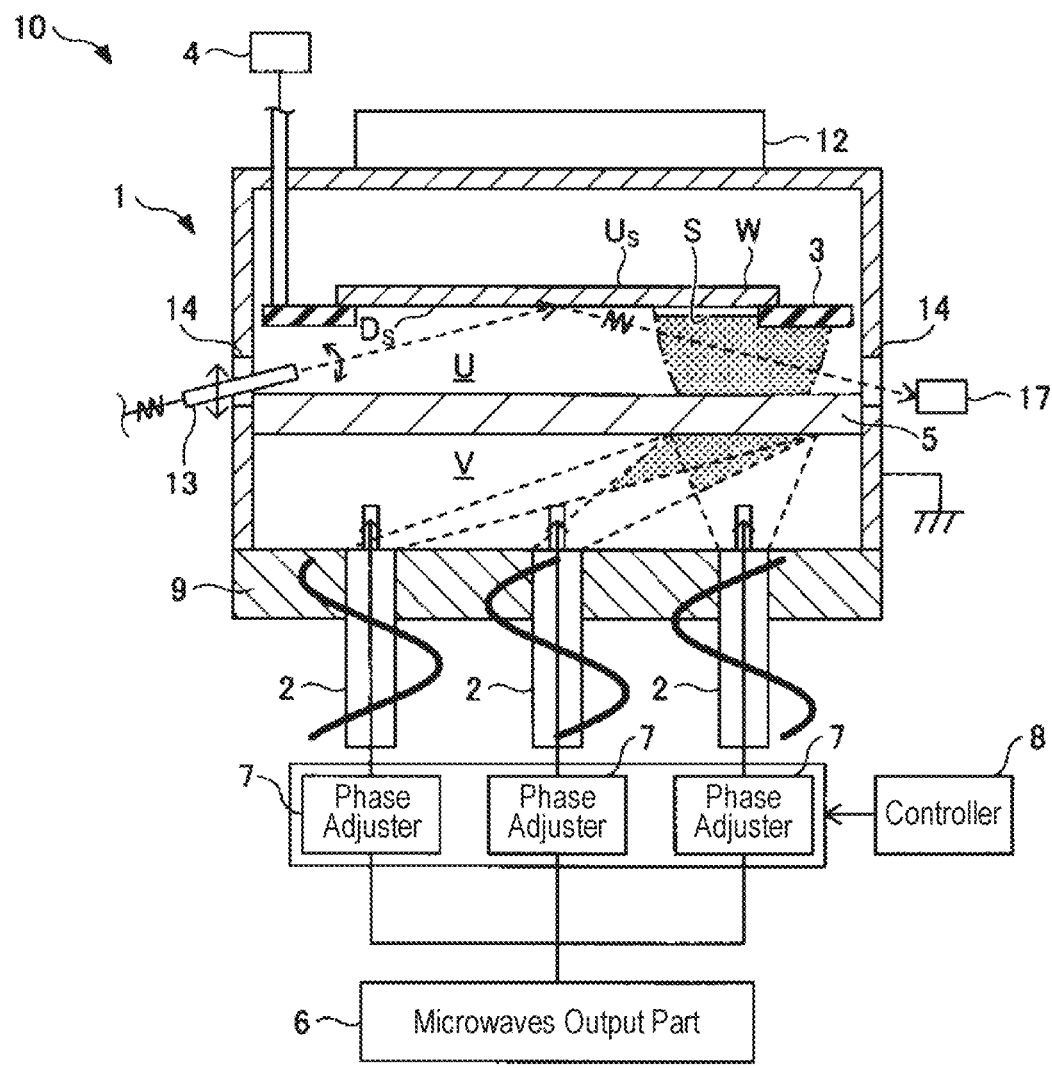
FIG. 7 is a view illustrating another exemplary position of an optical sensor of a plasma processing apparatus according to an embodiment of the present disclosure.
Figure 8:
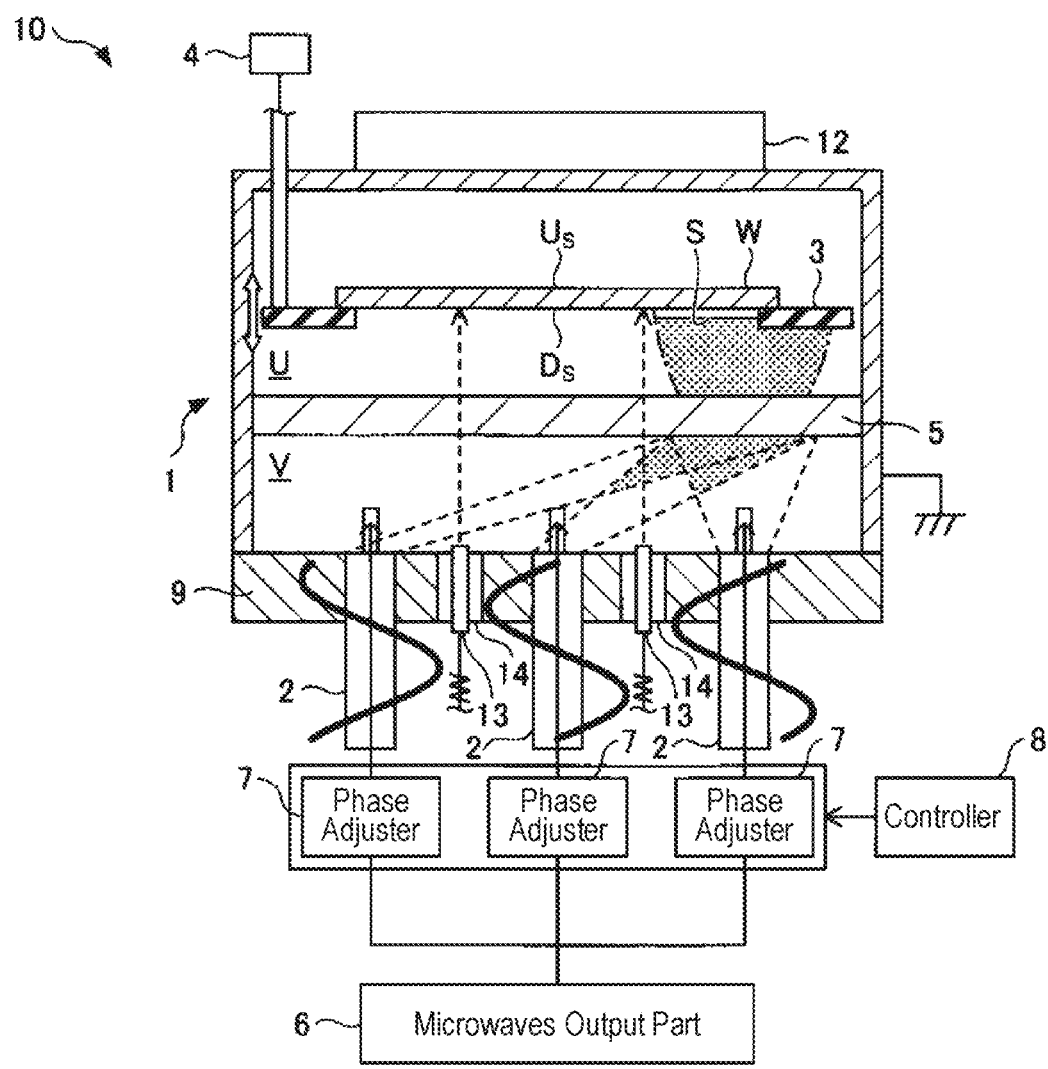
FIG. 8 is a view illustrating other exemplary positions of optical sensors of a plasma processing apparatus according to an embodiment of the present disclosure.

The plasma processing apparatus 10 includes a sensor that measures a degree of curvature of the substrate W held by the substrate holding mechanism 3. Regarding the sensor, optical sensors 13 will be described with reference to FIGS. 5 to 8 as an example. FIG. 5 is a view illustrating exemplary positions of the optical sensors 13 of the plasma processing apparatus 10 according to an embodiment. FIGS. 6A to 6C are exemplary plan views taken along a plane A-A in FIG. 5. FIG. 7 is a view illustrating another exemplary position of the optical sensor 13 of the plasma processing apparatus 10 according to an embodiment of the present disclosure. FIG. 8 is a view illustrating another exemplary position of the optical sensors 13 of the plasma processing apparatus 10 according to an embodiment of the present disclosure.

The optical sensors 13 illustrated in FIGS. 5 to 8 measure the degree of curvature of the substrate W. Information indicating the degree of curvature of the substrate W may be a measurement value of any one of a state of a front surface Us of the substrate W, a state of a rear surface Ds of the substrate W, and a thickness of a film S formed on the rear surface Ds of the substrate W. In the plasma processing apparatus 10 illustrated in FIGS. 5 to 8, the film is formed on the rear surface Ds of the substrate W such that the stress of the substrate W is relieved to make the substrate W flat while measuring the degree of curvature of the substrate W by the optical sensors 13. As the measuring devices configured to measure the degree of curvature of the substrate W, an optical sensor 13 and a controller 8 may be combined, or a measurement device in which an optical sensor 13 and an optical monitor are combined may be installed at the processing container 1.

In the example of FIG. 5, a plurality of optical sensors 13 are installed at the ceiling of the processing container 1. Examples of the number of optical sensors 13 are shown in FIGS. 6A to 6C, each of which is taken along the A-A plane in FIG. 5. In the example of FIG. 6A, a total of nine optical sensors 13 are provided, including one optical sensor 13 located at the center of the ceiling and eight optical sensors 13 arranged to surround the central optical sensor 13. In the example of FIG. 6B, a total of five optical sensors 13 are provided, including one optical sensor located at the center of the ceiling and four optical sensors 13 arranged at an equidistance around the central optical sensor 13. In the example of FIG. 6C, a total of thirteen optical sensors 13 are provided, including nine optical sensors 13 located at the positions illustrated in FIG. 6A and four optical sensors 13 arranged at equal intervals on the outer periphery thereof.

Returning to FIG. 5, the controller 8 causes light beams having a predetermined frequency to be incident on the front surface Us of the substrate W via transmission windows 14 that transmit light from the plurality of optical sensors 13. Then, a plurality of light beams resulting from reflection of light beams on the front surface Us of the substrate W are received by a light receiver (not illustrated), and the curved state of the substrate W is directly measured based on a state of the received light beams. Since the curved state of the front surface Us of the substrate W can be directly measured, the measurement accuracy is high. Further, the larger the number of optical sensors 13, the higher the measurement accuracy but with higher cost. Accordingly, by disposing at least five optical sensors 13 at the positions illustrated in FIG. 6B, it is possible to measure the curved state of the substrate W and to suppress an increase in cost. Meanwhile, considering the measurement accuracy, specifically nine optical sensors 13 may be arranged at the positions illustrated in FIG. 6A, and more specifically, thirteen optical sensors 13 may be arranged at the positions illustrated in FIG. 6C.

In the example of FIG. 7, an optical sensor 13 is installed at the side wall of the processing container 1. The optical sensor 13 is capable of changing a direction of an optical axis. In order to measure the curved state of the substrate W, the optical sensor 13 causes light to be obliquely incident on the rear surface Ds of the substrate W from the side wall of the processing container 1 via a transmission window 14. The light is irradiated to scan the rear surface Ds of the substrate W by changing the direction of the optical axis. The reflection of the light is received by a light receiver 17 via a transmission window 14 on the opposite side. The curved state of the substrate W is measured based on the state of the received light. In this case, the measurement accuracy is high because the curved state of the substrate W is directly measured based on the reflection of incident light.

However, the curved state of the substrate W may be indirectly measured by measuring the thickness of the film S on the rear surface Ds of the substrate W by using a film thickness meter. For example, in the example of FIG. 8, optical sensors 13 are installed at the bottom plate 9 of the processing container 1. Light beams having a predetermined frequency are incident from the plurality of optical sensors 13 via the transmission windows 14 from the bottom portion of the processing container 1. The light beams pass through the dielectric window 5 and are incident on and reflected from the rear surface Ds of the substrate W. The reflected light beams are received by a light receiver (not illustrated), and the thickness of the film formed on the rear surface Ds of the substrate W is measured based on the state of the received light beams. A correlation between the film thickness and the curved state (warpage) of the substrate W is measured in advance and stored in the controller 8 as information indicating a relational expression and a correlation. Accordingly, it is possible to indirectly estimate the curved state of the substrate W by measuring the film thickness on the rear surface of the substrate W.

As described above, the information indicating the degree of curvature of the substrate W may be obtained based on the results obtained by measuring one of the state of the front surface Us of the substrate W, the state of the rear surface Ds of the substrate W, or the film thickness on the rear surface of the substrate W by using the optical sensors 13. The controller 8 controls the phases of the plurality of microwaves irradiated from the phased array antennas 2 according to the information indicating the degree of curvature of the substrate W measured by the optical sensors 13.

The substrate, for which a curved state is to be measured by the optical sensors 13, may be a dummy substrate having a front surface on which a film is formed under the same film formation conditions as product substrates W, each product substrate W, or at least one of a plurality of substrates W. The at least one substrate W of the plurality of substrates may be, for example, the first substrate W of a lot or the last substrate W of the lot. However, the substrate to be measured is not limited thereto.

For example, when the substrates W are processed under the same film formation conditions, measurement values obtained by measuring a curved state of a dummy substrate having a front surface Us, on which a film is formed under the same film formation conditions, may be used when controlling film formation on rear surfaces Ds of all substrates W, each of which has a front surface Us on which a film is formed under the same film formation conditions. However, the present disclosure is not limited thereto. For example, even when the substrates W are processed under the same film formation conditions, film formation on the rear surfaces Ds may be controlled based on the measurement result of each substrate W while performing the measurement for each substrate W. Accordingly, even when the curved state differs from substrate to substrate, it is possible to form a film S having an appropriate thickness in an appropriate region on the rear surface Ds of each substrate W and to relieve the stress on each substrate W so as to reduce the curvature thereof.

The plasma processing apparatus 10 may not be equipped with measurement devices such as optical sensors 13. In this case, after a film is formed on a front surface Us of a substrate W on the basis of predetermined film formation conditions, the substrate W may be transported to an orienter (not illustrated). Then, the degree of curvature of the substrate W may be measured by reflection of light by, for example, making the light incident on the front surface of the substrate W while rotating the substrate W by using the orienter. The measurement value is transmitted from a controller installed in the orienter to the controller 8 of the plasma processing apparatus 10. As a result, the controller 8 controls the phases of the plurality of microwaves irradiated from the phased array antennas 2 according to the received measurement value indicating the degree of curvature of the substrate W.

[Plasma Processing Method]

Figure 9:
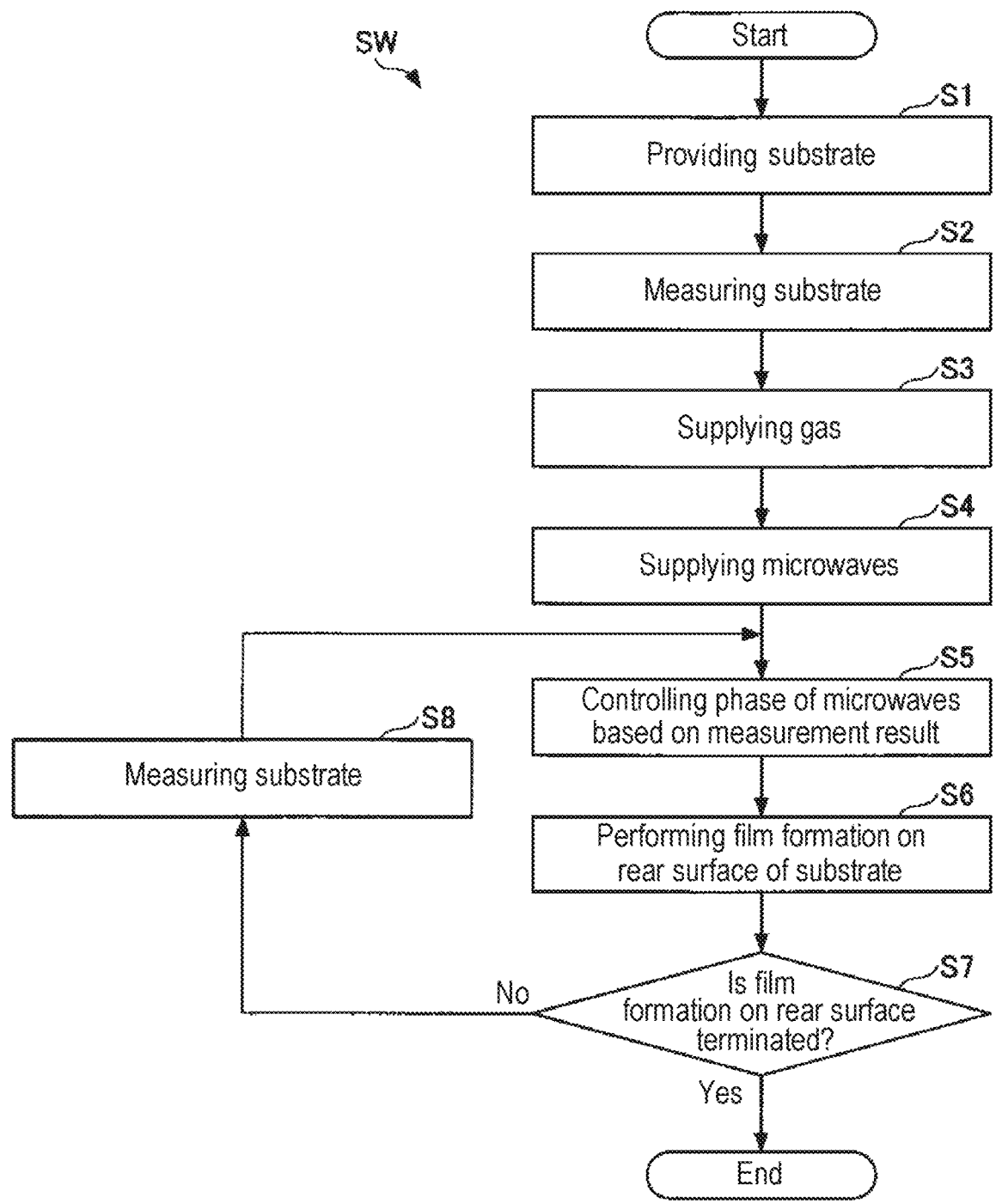
FIG. 9 is a flowchart illustrating an exemplary plasma processing method according to an embodiment of the present disclosure.

Next, an exemplary plasma processing method executed by the plasma processing apparatus 10 will be described with reference to FIG. 9. FIG. 9 is a flowchart illustrating an exemplary plasma processing method according to an embodiment of the present disclosure. This process is controlled by the controller 8. In the plasma processing method SW illustrated in FIG. 9, for the first substrate, a film may be formed on the rear surface of a dummy substrate, and for the second and subsequent substrates, a film may be formed on the rear surface of a product substrate W.

When this process is started, the controller 8 provide a substrate W by loading the substrate W into the processing container 1 and holding the substrate W on the substrate holding mechanism 3 (step S1). Next, the controller 8 measures the curved state of the substrate W by using the optical sensors 13 (step S2). Next, the controller 8 supplies gas from the gas supply part 16 (step S3). Next, the controller 8 outputs microwaves from the microwaves output part 6 (step S4).

Next, the controller 8 uses phase adjusters 7 to control the phases of respective microwaves irradiated from the seven phased array antennas 2 based on the measurement values indicating the curved state of the substrate W (step S5). As a result, respective phase-controlled microwaves are irradiated from each phased array antenna 2 into the processing container 1. The respective phase-controlled microwaves interfere with each other in the space V and the microwaves are focus-matched. As a result, local plasma is generated between the dielectric window 5 and the substrate holding mechanism 3. The controller 8 locally forms a film on the rear surface Ds of the substrate W by using the local plasma (step S6).

Next, the controller 8 determines whether to terminate the film-forming process (step S7). When it is determined not to terminate the film-forming process, the controller 8 measures the curved state of the substrate W again by the optical sensors 13 (step S8). Then, the controller 8 uses the phase adjusters 7 to control the phase of respective microwaves irradiated from the seven phased array antennas 2 based on the measurement results (step S5), and performs local film formation on the rear surface Ds of the substrate W (step S6). The controller 8 repeats the processing of steps S5 to S8 until it determines that the film-forming process is to be terminated in step S7, and when it is determined to terminate the film-forming process, the controller 8 terminates this process. When the controller 8 determines that the curved state of the substrate W is within a permissible range based on the measurement results in step S8, the controller 8 may terminate the film-forming process in step S7 without performing steps S5 to S6. When terminating the processing, the output of microwaves is stopped, and the supply of gas is stopped.

According to the aforementioned plasma processing method, the phased array antennas 2 are installed at the rear surface side of the substrate W, the curved state of the substrate is measured, and the measurement results are fed back to each of the phased array antennas 2 to control the phase of respective microwaves. This makes it possible to relieve a stress on the substrate by forming a film in a predetermined area on the rear surface Ds of the substrate W.

The substrate W having the film formed on the rear surface thereof by the aforementioned processing method is transported to another processing container, and the curved state of the substrate W is measured again. When the curved state of the substrate W is outside the predetermined permissible range, the substrate W may be transported to the plasma processing apparatus 10, and the film formation may be performed again on the rear surface Ds of the substrate W.

[Phase Control Simulation Result]

Figure 10A:
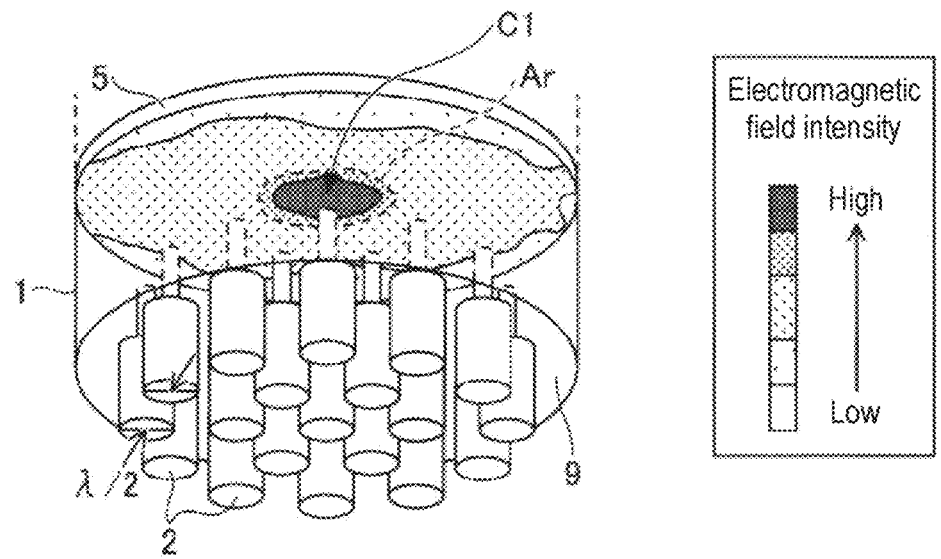
FIGS. 10A to 10C are views illustrating exemplary electric field distributions in a dielectric window according to an embodiment of the present disclosure.
Figure 10B:
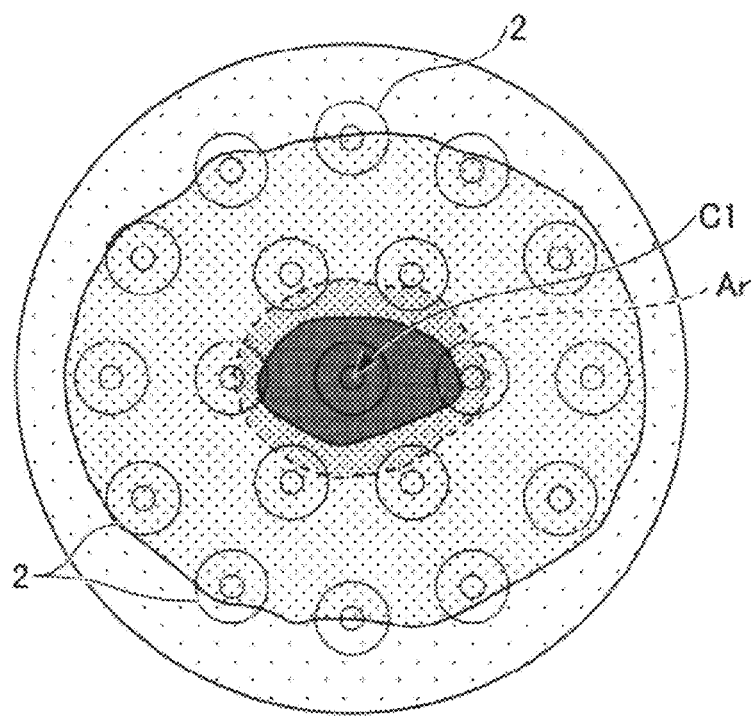
Figure 10C:
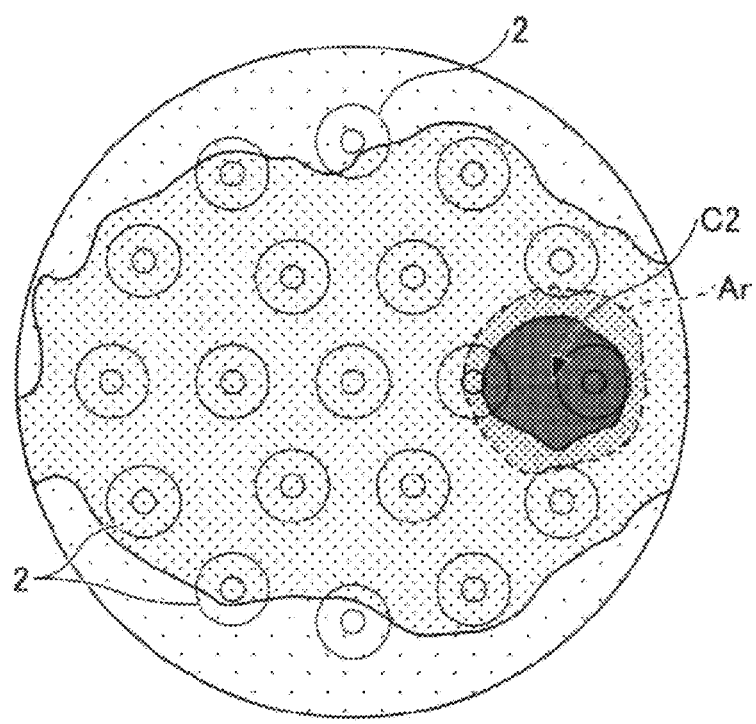

As illustrated in FIG. 10A, FIGS. 10B and 10C illustrate exemplary simulation results of electric field distributions in the dielectric window 5 according to an embodiment of the present disclosure when the controller 8 uses the phase adjusters 7 to control the phases of microwaves output from nineteen phased array antennas 2.

The simulation conditions were set such that microwaves having the same power are irradiated from the nineteen phased array antennas 2. The electric field strength of the microwaves illustrated in FIGS. 10A to 10C shows a state in which the electric field strength is high in the dark portion.

FIG. 10B illustrates an electric field intensity distribution obtained when the phase $\delta(x)$ of the microwaves was controlled to form a focus-matching portion Ar centered on a focal position C1 near the center of the dielectric window 5.

Then, as illustrated in FIG. 10C, as a result of controlling the phase $\delta(x)$ of the microwaves to be mutually strengthened at a focal position C2 on the dielectric window 5, the electric field of the microwaves was strengthened in the focus-matching portion Ar centered on the focal position C2. By using this simulation, it has been confirmed that it is possible to freely perform focus-matching control through the phase control.

As described above, according to the plasma processing apparatus 10 of the present embodiment, the electric field distribution in the dielectric window 5 can be changed regardless of the arrangement of the phased array antennas 2. As a result, since it is possible to freely perform the focus-matching control through the focus control, it is possible to freely control the plasma distribution.

By the aforementioned control, it is possible to eliminate the curved state of a substrate W, as illustrated in FIG. 11. For example, when the substrate W is warped like a bowl so that the center of the substrate W is recessed, for example, a film is formed over the entire rear surface Ds of the substrate W. At that time, a film thickness Se on an outer peripheral side of a film S is made to be greater than a film thickness Sc on a central side of the film S. This makes it possible to relieve the stress of the substrate W and to make the substrate W flat.

However, the film-forming method is not limited thereto. For example, a film may be formed on the central side of the rear surface Ds of the substrate W, but no film may be formed on the outer peripheral side of the rear surface Ds. Further, depending on the curved state of the substrate W, a film may be formed on the outer peripheral side of the rear surface Ds of the substrate W, but no film may be formed on the central side of the rear surface Ds.

Whether the film formed on the rear surface Ds is a compressive stress film or a tensile stress film depends not only on a type of the film, but also on film formation conditions, even among films of the same type. Therefore, by appropriately setting at least one of the film-forming position, the type of the film, and the film formation conditions according to measurement results indicating the curved state of the substrate W, it is also possible to eliminate the curved state of the substrate W, thereby making the substrate flat.

The plasma processing apparatus 10 according to the present disclosure has been described by taking a plasma processing apparatus that irradiates microwaves as an example, but the present disclosure is not limited thereto. The phased array antennas 2 included in the plasma processing apparatus 10 according to the present disclosure may irradiate electromagnetic waves having a frequency of 100 MHz or higher, such as UHF, without being limited to microwaves. More specifically, the phased array antennas 2 may irradiate electromagnetic waves having a frequency in the range of 1 GHz to 3 GHz. The higher the frequency is, a faster phase control becomes possible.

In addition, in the aforementioned embodiments, the space V above the dielectric window 5 is an atmospheric space, but is not limited thereto. For example, the space V below the dielectric window 5 may be filled with a dielectric of the same material as that of the dielectric window 5 or a different material therefrom. Since a wavelength of the microwaves propagating through the dielectric can be shortened by filling the space V with the dielectric, the size of the plasma processing apparatus 10 can be reduced.

In the aforementioned embodiments, the space V is an atmospheric space, but the space V may also be a vacuum space. However, when the space V is a vacuum space, the phase control is performed in the vacuum space, and plasma may be generated in the space V. In view of the foregoing, the space V may be an atmospheric space. Further, by setting the distance between the irradiating portion 125 and the dielectric window 5 to be larger than ¼ of the wavelength k of microwaves, it is possible to sufficiently focus-match the microwaves on the dielectric window 5.

As described above, according to the plasma processing apparatus and the plasma processing method of the embodiments described above, the phased array antennas 2 are installed below the substrate W. Thus, it is possible to locally form a film on the rear surface Ds of the substrate W by feedback-controlling the phased array antennas 2 by using the results of measuring the curved state of the substrate W. This makes it possible to relieve the stress of the substrate W, thereby making the substrate W flat.

It should be understood that the plasma processing apparatus and the plasma processing method according to the embodiments of the present disclosure are illustrative and not restrictive in all aspects. The embodiments described above may be modified and improved in various forms without departing from the scope and spirit of the appended claims. The matters described in the embodiments may take other configurations to the extent they are not inconsistent, or may be combined to the extent they are not inconsistent.

According to an aspect, it is possible to perform a local film formation on the rear surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a processing container;
a substrate holder disposed within the processing container and configured to hold a substrate thereon;
a dielectric window disposed below the substrate holder to be spaced apart from the substrate holder and configured to form a plasma-generating space between the dielectric window and the substrate;
a gas supply port installed in a side wall of the processing container between the dielectric window and the substrate holder and configured to supply a gas to the plasma-generating space;
a plurality of phased array antennas disposed below the dielectric window and configured to irradiate a plurality of electromagnetic waves to generate a local plasma in the plasma-generating space to perform a local film formation on a rear surface of the substrate;
a sensor configured to measure a degree of curvature of the substrate held by the substrate holder; and
a controller configured to control phases of the electromagnetic waves irradiated from the phased array antennas according to the degree of curvature of the substrate measured by the sensor,
wherein the substrate holder is connected to a driving mechanism, and
wherein the substrate holder is further configured to be movable vertically within the processing container by the driving mechanism.

2. The plasma processing apparatus of claim 1, wherein the controller is further configured to control a film formation on the rear surface of the substrate according to the degree of curvature of the substrate by a plasma generated from the gas in the plasma-generating space.

3. The plasma processing apparatus of claim 2, wherein the controller is configured to control the film formation on the rear surface of the substrate by changing the phases of the electromagnetic waves over time.

4. The plasma processing apparatus of claim 3, wherein vertical distances from the phased array antennas to the dielectric window are larger than $\lambda/4$ with respect to a wavelength $\lambda$, of the electromagnetic waves.

5. The plasma processing apparatus of claim 4, wherein each of the phased array antennas includes a monopole antenna.

6. The plasma processing apparatus of claim 5, wherein a distance between centers of two adjacent phased array antennas among the phased array antennas is smaller than $\lambda/2$ with respect to the wavelength $\lambda$, of the electromagnetic waves.

7. The plasma processing apparatus of claim 6, wherein a frequency of the electromagnetic waves is 100 MHz or higher.

8. The plasma processing apparatus of claim 1, wherein vertical distances from the phased array antennas to the dielectric window are larger than $\lambda/4$ with respect to a wavelength $\lambda$, of the electromagnetic waves.

9. The plasma processing apparatus of claim 1, wherein each of the phased array antennas includes a monopole antenna.

10. The plasma processing apparatus of claim 1, wherein a distance between centers of two adjacent phased array antennas among the phased array antennas is smaller than $\lambda/2$ with respect to a wavelength $\lambda$, of the electromagnetic waves.

11. The plasma processing apparatus of claim 1, wherein a frequency of the electromagnetic waves is 100 MHz or higher.

12. The plasma processing apparatus of claim 7, wherein the frequency of the electromagnetic waves is 1 GHz to 3 GHz.

* * * * *